United States Patent [19]

Kusakabe

[11] 4,282,490
[45] Aug. 4, 1981

[54] PULSE COUNT TYPE FM DEMODULATOR CIRCUIT

[75] Inventor: Hiromi Kusakabe, Yokohama, Japan

[73] Assignee: Tokyo Shibaura Denki Kabushiki Kaisha, Kawasaki, Japan

[21] Appl. No.: 6,243

[22] Filed: Jan. 24, 1979

[30] Foreign Application Priority Data

Jan. 27, 1978 [JP] Japan .................................. 53/8099

[51] Int. Cl.³ .......................... H03D 3/00; H03K 9/06
[52] U.S. Cl. .................................... 329/103; 329/128; 357/14; 375/80; 455/214
[58] Field of Search ............... 329/103, 110, 126, 128; 325/344, 349; 455/214; 375/80

[56] References Cited

U.S. PATENT DOCUMENTS

| 2,956,227 | 10/1960 | Pierson | 329/128 X |
| 3,473,133 | 10/1969 | Hummel | 329/103 X |
| 3,493,877 | 2/1970 | Jacobson | 329/103 |

FOREIGN PATENT DOCUMENTS 1808664 6/1969 Fed. Rep. of Germany.

OTHER PUBLICATIONS

Funkschau 1970, Heft 15, pp. 500–502.
Elektor, Jul./Aug. 1972, p. 762.
Radio Fernsehen Elektronik 23 (1974), H. 15, pp. 479–482.
Thomas, "Heath's Digital FM Tuner", Radio-Electronics, May 1973, pp. 42–45, 50, 98.

Primary Examiner—Siegfried H. Grimm
Attorney, Agent, or Firm—Cushman, Darby & Cushman

[57] ABSTRACT

Disclosed is a demodulator circuit which comprises a limiter circuit, a differentiation circuit, a monostable multivibrator circuit and an integration circuit. The differentiation circuit is composed of a delay circuit and a differential logic circuit. The differentiation circuit supplies the monostable multivibrator circuit with a trigger pulse whose pulse width is determined by the delay circuit. The monostable multivibrator circuit is formed of a differential circuit, having a current source at its output circuit. The current source tends to increase the output voltage of the monostable multivibrator circuit and a driving impedance for the integration circuit.

12 Claims, 13 Drawing Figures

PULSE COUNT TYPE FM DEMODULATOR CIRCUIT

This invention relates to a pulse count type FM demodulator circuit.

In prior art pulse count type FM demodulator circuits, large value capacitors and resistors are required in various parts because of design constraints imposed by the circuit configuration. The use of so many large value capacitors and resistors makes it difficult to construct such prior art demodulator circuits in integrated circuit (IC) form.

The object of this invention is to provide a pulse count type demodulator circuit suitable for construction as an IC, minimizing the use of large value capacitors and resistors.

In order to attain the above object, there is provided a demodulator comprising a limiter circuit for providing a first signal corresponding only to the frequency component of an input signal, a differentiation circuit for providing a trigger pulse synchronized with the first signal, a vibrator circuit triggered by the trigger pulse for providing a second signal the duty of which is varied in accordance with the frequency of the trigger pulse, and an integration circuit for providing an output signal having a level corresponding to the duty of the second signal; characterized in that the differentiation circuit includes an AND gate circuit and a delay circuit, the first signal is applied to a first input terminal of the AND gate circuit and the delay circuit, a second input terminal of the AND gate circuit is supplied with a third signal from the delay circuit, and the AND gate circuit provides the trigger pulse by detecting the logical sum of a first logic level of the first signal and a second logic corresponding to the logic level of the third signal.

The demodulator circuit of the aforesaid configuration may suitably be formed as an IC. Moreover, it can have a differential circuit arrangement as a whole to provide a circuit stabilized against temperature changes.

This invention can be more fully understood from the following detailed description when taken in conjunction with the accompanying drawings, in which.

Figure 1:
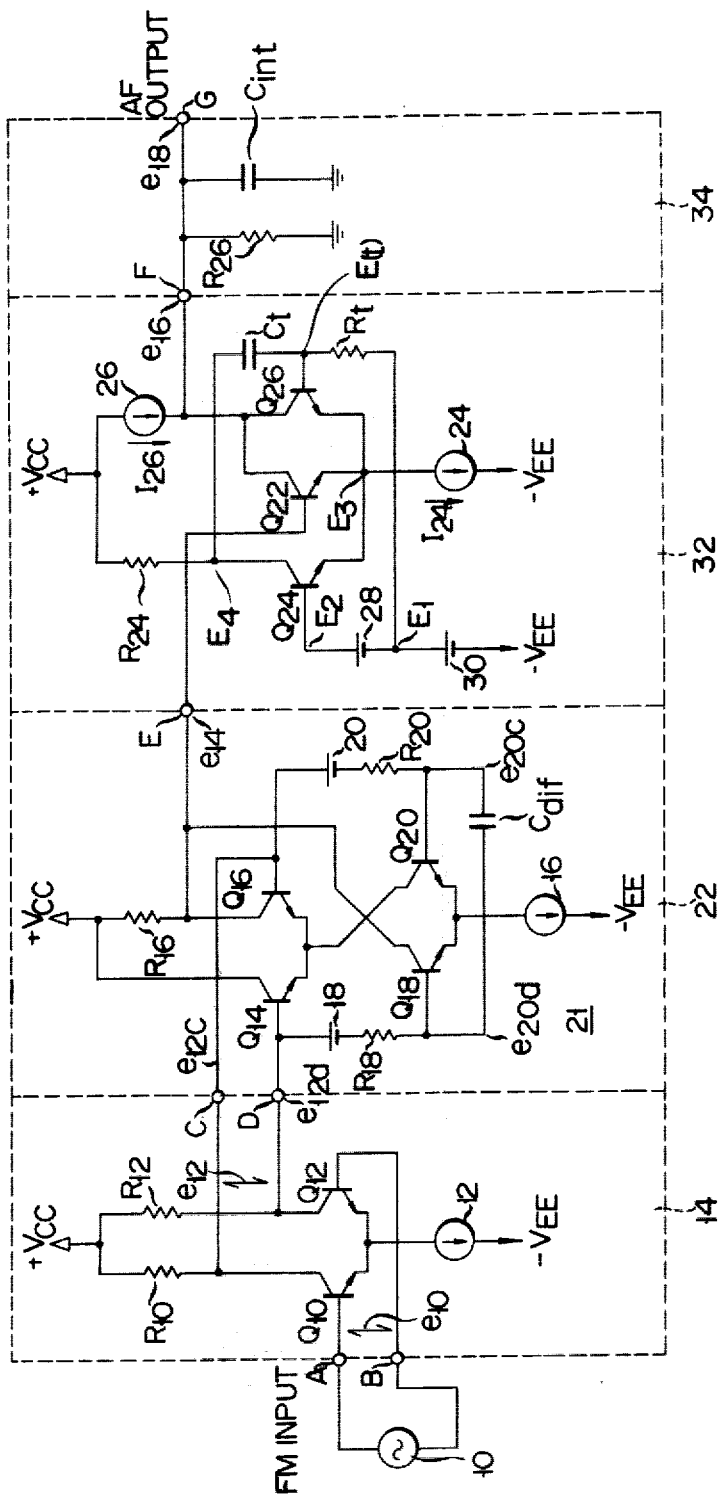
FIG. 1 is a schematic circuit diagram showing the basic arrangement of a demodulator circuit according to this invention.
Figure 8:
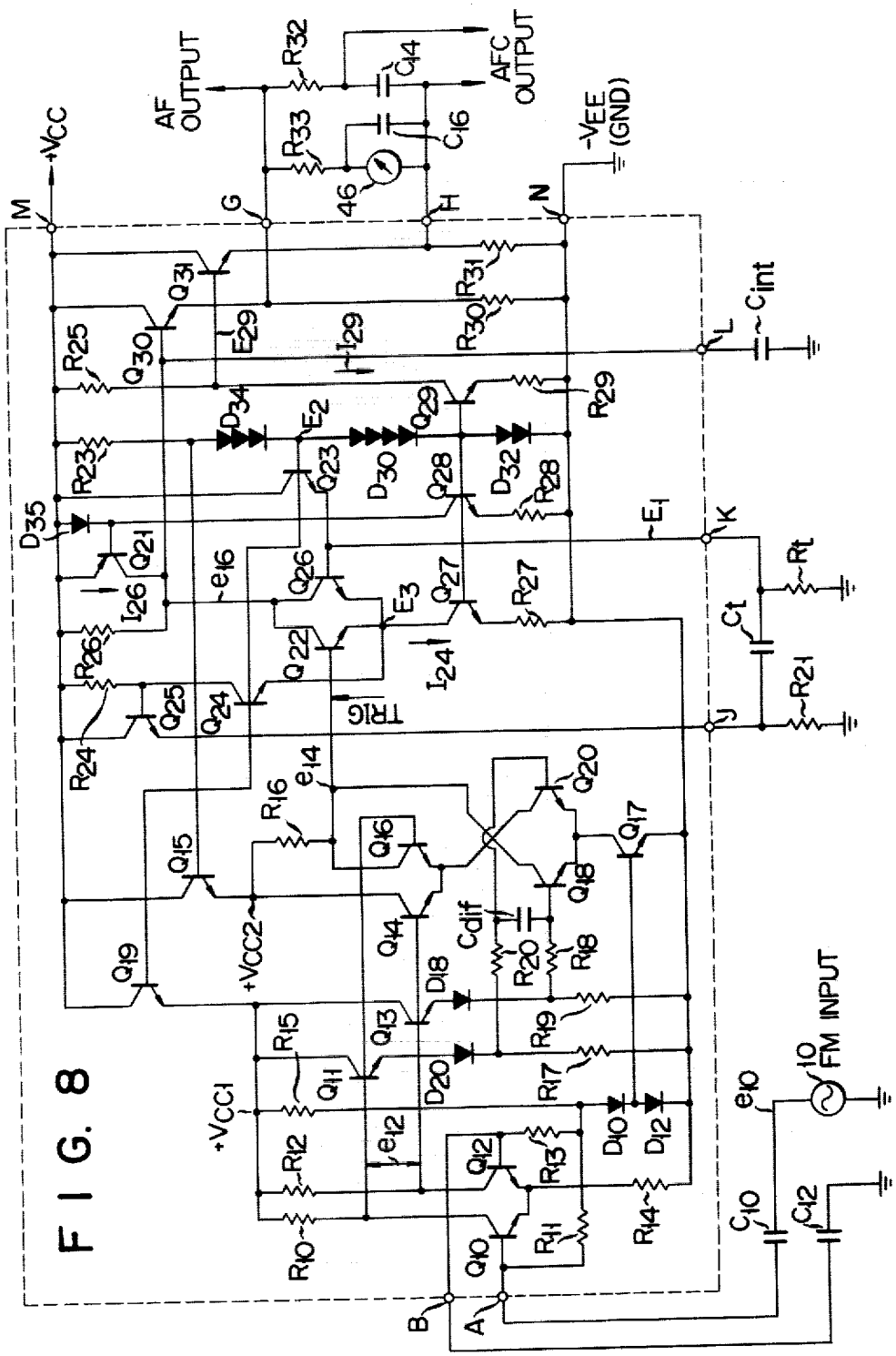
FIG. 8 is a detailed circuit diagram corresponding to the schematic circuit diagram of FIG. 1.
Figure 9:
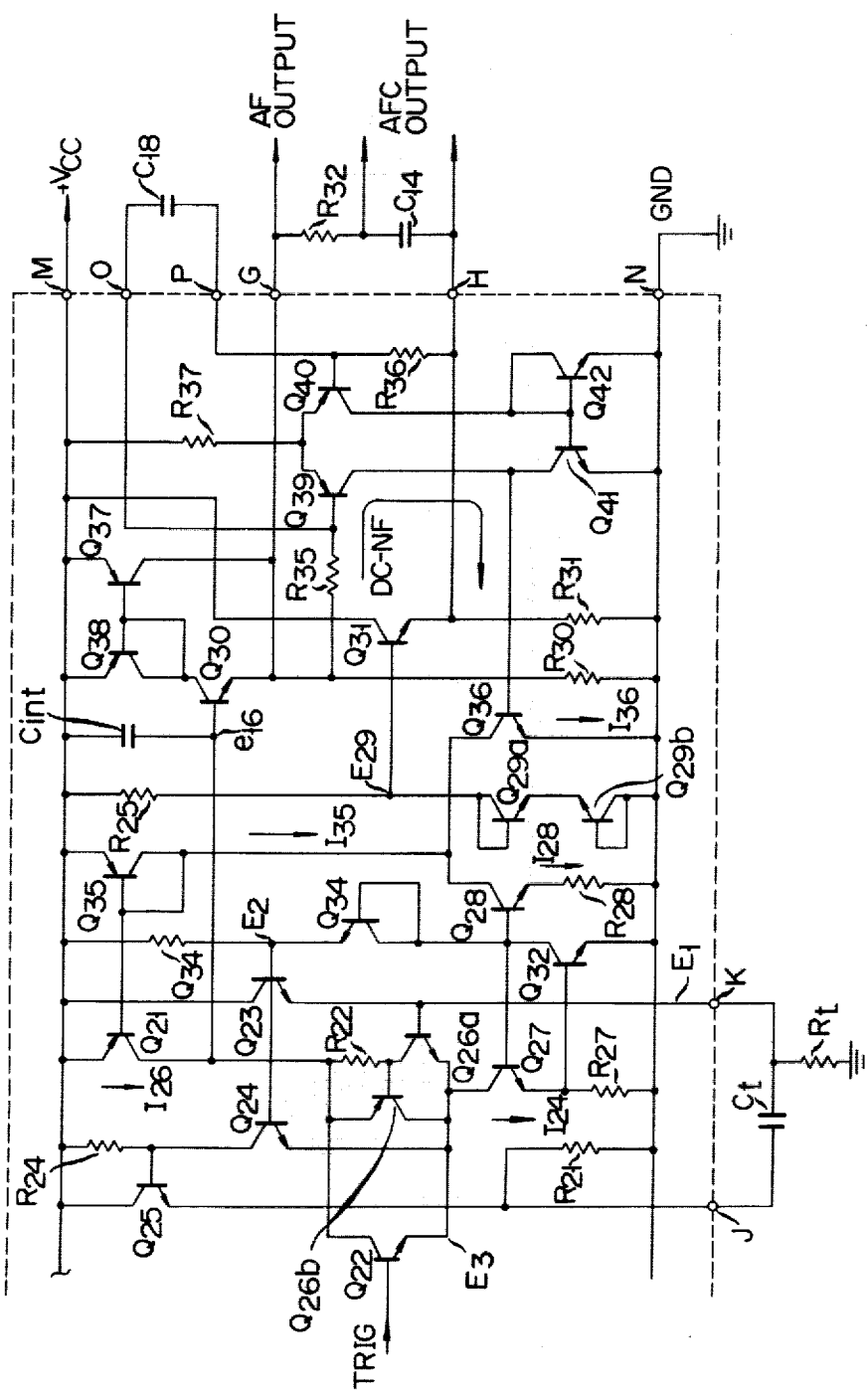
FIG. 9 shows a modification of the circuit diagram of FIG. 8.
Figure 10:
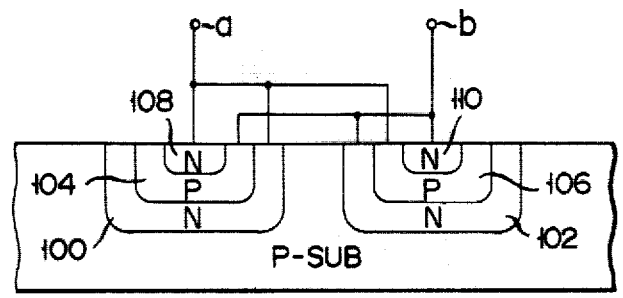
Figure 11:
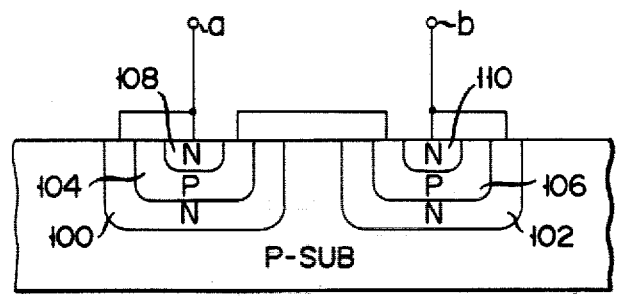
Figure 12:
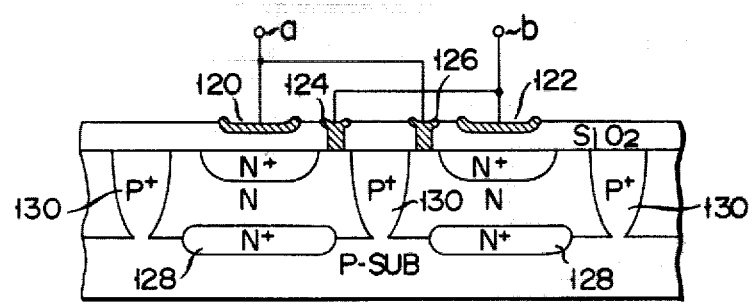

FIGS. 10 to 12 show structures for converting a differentiation capacitor $C_{dif}$ or integration capacitor $C_{int}$ as shown in FIGS. 1, 8 and 9 into an IC-type version, wherein: FIG. 10 shows a structure in which the capacitor is formed of staggered, parallel-connected PN junction diodes; FIG. 11 shows a structure in which the capacitor is formed of staggered, series-connected PN junction diodes; and FIG. 12 shows a structure in which the capacitor is formed of the gate capacitances of staggered, parallel-connected MOS transistors.

Now there will be described preferred embodiments of the FM demodulator circuit according to this invention. To avoid repeated description, identical or like reference numerals will be used for designating equivalent or similar parts.

FIG. 1 is a schematic circuit diagram showing the basic arrangement of the demodulator circuit. An FM signal source 10 is connected to the bases of NPN transistors $Q_{10}$ and $Q_{12}$ through input terminals A and B respectively. The emitters of the transistors $Q_{10}$ and $Q_{12}$ are connected to a negative power source $-V_{EE}$ through a current source 12. The collectors of the transistors $Q_{10}$ and $Q_{12}$ are connected to a positive power source $+V_{CC}$ via load resistances $R_{10}$ and $R_{12}$ respectively. A differential amplifier circuit consisting of the transistors $Q_{10}$ and $Q_{12}$ clips an input signal $e_{10}$ from the signal source 10 which has an over-amplitude. A square-wave signal $e_{12}$ is formed between the collectors of the transistors $Q_{10}$ and $Q_{12}$. That is, this differential circuit constitutes a differential amplifier type limiter circuit 14 which is stabilized against temperature changes.

The collectors of the transistors $Q_{10}$ and $Q_{12}$ are connected also to the bases of NPN transistors $Q_{16}$ and $Q_{14}$ via terminals C and D, respectively. The collector of the transistor $Q_{14}$ is directly connected to the positive power source $+V_{CC}$, while the collector of the transistor $Q_{16}$ is connected to the positive power source $+V_{CC}$ through a resistor $R_{16}$. The emitters of the transistors $Q_{14}$ and $Q_{16}$ are connected to the collector of an NPN transistor $Q_{20}$, whose emitter, together with the emitter of an NPN transistor $Q_{18}$, is connected to the negative power source $+V_{EE}$ through a current source 16. The collector of the transistor $Q_{18}$ is connected to the collector of the transistor $Q_{16}$. The base of the transistor $Q_{18}$ is connected to the base of the transistor $Q_{14}$ through a resistor $R_{18}$ and a level shift voltage source 18. The base potential of the transistor $Q_{18}$ is lowered below that of the transistor $Q_{14}$ by the voltage source 18. Likewise, the base of the transistor $Q_{20}$ is connected to the base of the transistor $Q_{16}$ through a resistor $R_{20}$ and a level shift voltage source 20. The bases of the transistors $Q_{18}$ and $Q_{20}$ are connected to each other through a differentiation capacitor $C_{dif}$. Since the capacitance of capacitor $C_{dif}$ will usually be on the order of 10 picofarads, distributed capacitances and/or the input capacitances of the transistors $Q_{18}$ and $Q_{20}$ can be utilized.

A level shift caused by the voltage sources 18 and 20 will apply a substantial operating voltage between the collector and emitter of the transistors $Q_{18}$ and $Q_{20}$. Without the level shift, the potential difference between the collector and emitter of the transistors $Q_{18}$ and $Q_{20}$ would be reduced nearly to zero, causing the circuit to stop operating. If the transistors $Q_{14}$ and $Q_{16}$ are depression-type N-channel FET's, however, such level shift is not always required. Because, in this case, the source potentials of the transistors (FET's) $Q_{14}$ and $Q_{16}$ may be made higher than emitter potentials of the transistors $Q_{18}$ and $Q_{20}$.

A two-stage stacked differential circuit composed of the transistors $Q_{14}$ to $Q_{20}$ operates as a logic circuit 21. This differential logic circuit is described in detail in Japanese Pat. Appl. Ser. No. 1976/49,711 by the inventor hereof. This application was disclosed on Nov. 7, 1977. A differentiation circuit 22 of this invention is a practical application of the differential logic circuit. The differential time constant of the diffrentiation circuit 22 is determined chiefly by the resistors $R_{18}$ and $R_{20}$ and the capacitor $C_{dif}$. The operation of the differentiation circuit 22 will be described later in connection with its equivalent circuits. Formed of a differential circuit, differentiation circuit 22, exhibits a high degree of temperature-stability. The differentiation circuit 22 differentiates the square-wave signal $e_{12}$ applied to the terminals C and D, and supplies a trigger pulse $e_{14}$ to the collector of the transistor $Q_{16}$.

The collector of the transistor $Q_{16}$ is connected to the base of an NPN transistor $Q_{22}$ through a terminal E. The emitter of the transistor $Q_{22}$, along with the emitters of NPN transistors $Q_{24}$ and $Q_{26}$, is connected to the negative power source $-V_{EE}$ through a current source 24. The collectors of the transistors $Q_{22}$ and $Q_{26}$ are connected to the positive power source $+V_{CC}$ through a current source 26. The collector of the transistor $Q_{24}$ is connected to the positive power source $+V_{CC}$ through a resistor $R_{24}$, while the base of the transistor $Q_{24}$ is connected to a circuit with a suitable potential, such as the negative power source $-V_{EE}$, through series-connected bias voltage sources 28 and 30. The collector of the transistor $Q_{24}$ is connected also to the base of the transistor $Q_{26}$ through a capacitor Ct. The base of the transistor $Q_{26}$ is connected to the connection point of the voltage sources 28 and 30 via a resistor Rt. When the trigger pulse $e_{14}$ is not applied to the base of the transistor $Q_{22}$, the base potential of the transistor $Q_{26}$ is lower than that of the transistor $Q_{24}$. Namely, in a stationary state without the trigger pulse $e_{14}$, the transistor $Q_{26}$ is cut off by the voltage source 28.

The transistors $Q_{22}$ to $Q_{26}$ constitute a differential (emitter-coupled) monostable multivibrator (MMV) 32. The turn-on time of the MMV 32 is determined mainly by the capacitor Ct and the resistor Rt. As for the operation of the MMV 32, it will be described later in detail. The MMV 32 can be formed as a circuit having extremely high stability by thermally compensating the base-emitter threshold voltages of the transistors $Q_{22}$ to $Q_{26}$. Such temperature compensation will also be described afterward. An output signal $e_{16}$ of the MMV 32 is taken out from the collector of the transistor $Q_{26}$. The duty of the signal $e_{16}$ may be changed with the pulse interval of the trigger pulse $e_{14}$.

Figure 2:
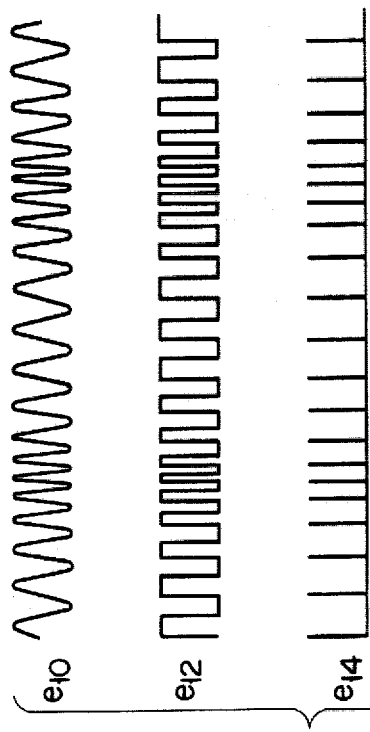
FIG. 2 shows waveforms for the principal parts of the circuit of FIG. 1.
Figure 2:
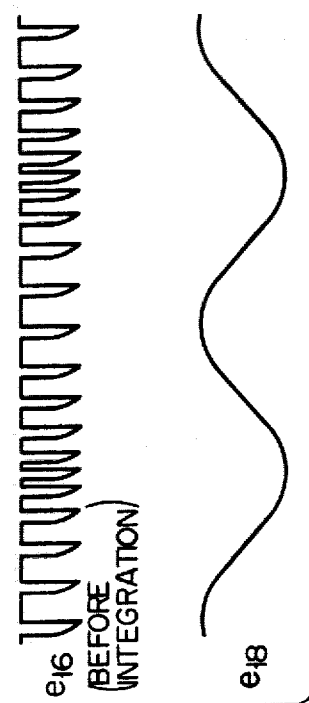

The collector of the transistor $Q_{26}$ is connected to an output terminal G through a terminal F. The terminal F is grounded via a resistor $R_{26}$ and an integration capacitor $C_{int}$. The resistor $R_{26}$ and the capacitor $C_{int}$ constitute an integration circuit 34. The signal $e_{16}$ is converted by the integration circuit 34 into an audio frequency (AF) signal $e_{18}$ in proportion to the duty thereof. If the maximum frequency deviation of the input signal $e_{10}$ is ±75 kHz, the time constant of the integration circuit 34 may suitably be selected at 1 μsec(fc≃160 kHz) or thereabout. This AF signal $e_{18}$ is a signal obtained by demodulating the input signal $e_{10}$ which has been frequency-modulated. The respective waveforms of the signals $e_{10}$ to $e_{18}$ have such relationships as shown in FIG. 2, for example.

In the pulse count type FM demodulator circuit consisting of the limiter circuit 14, differentiation circuit 22, MMV 32, and the integration circuit 34, this invention is characterized chiefly by the differentiation circuit 22 and the MMV 32.

Now there will be described the operation of the differentiation circuit 22. Prior to the description of the differentiating operation, there will be presented truth tables for the differential logic circuit 21 composed of the transistors $Q_{14}$ to $Q_{20}$. Table 1 shows a case in which the base potentials of the transistors $Q_{14}$ and $Q_{18}$ are fixed, that is, where the terminal D is at logic "0". Similarly, Table 2 shows a case in which the terminal C is at logic "0".

TABLE 1

| Logic level of base | | Logic level of terminal |
|---|---|---|
| $Q_{16}$ | $Q_{20}$ | E |
| 0 | 0 | 0 |
| 0 | 1 | 1 |
| 1 | 0 | 0 |
| 1 | 1 | 0 |

Note:
Logic level of terminal D is "0".

TABLE 2

| Logic level of base | | Logic level of terminal |
|---|---|---|
| $Q_{14}$ | $Q_{18}$ | E |
| 0 | 0 | 0 |
| 0 | 1 | 0 |
| 1 | 0 | 1 |
| 1 | 1 | 0 |

Note:
Logic level of terminal C is "0".

In Table 1, when the bases of the transistors $Q_{16}$ and $Q_{20}$ are both at logic level "0", the transistors $Q_{16}$ and $Q_{20}$ are cut off. Thereupon, the transistors $Q_{14}$ and $Q_{18}$ are turned on by an operation of the differential circuit. When the transistor $Q_{18}$ is turned on, the logic level of the terminal E becomes "0".

When the bases of the transistors $Q_{16}$ and $Q_{20}$ are at logic levels "0" and "1" respectively, the transistor $Q_{16}$ is cut off, and the transistor $Q_{20}$ is turned on. Then, the transistor $Q_{14}$ is turned on, while the transistor $Q_{18}$ is cut off by the differential circuit operation. Since the transistors $Q_{16}$ and $Q_{18}$ are cut off, the logic level of the terminal E becomes "1".

When the bases of the transistors $Q_{16}$ and $Q_{20}$ are at logic levels "1" and "0" respectively, the transistor $Q_{16}$ is turned on, and the transistor $Q_{20}$ is cut off. Then, the transistor $Q_{14}$ is cut off, while the transistor $Q_{18}$ is turned on. Since the transistor $Q_{18}$ is turned on, the logic level of the terminal E becomes "0".

When the bases of the transistors $Q_{16}$ and $Q_{20}$ are both at logic level "1", both these transistors $Q_{16}$ and $Q_{20}$ are turned on. Thereupon, the transistors $Q_{14}$ and $Q_{18}$ are both cut off. Since the transistors $Q_{16}$ and $Q_{20}$ are both turned on, the logic level of the terminal E becomes "0".

The correlation between Table 2 and the differential logic circuit 21 may easily be understood from the above description. In the differential logic circuit 21, the logic function of either Table 1 or 2 may be executed depending on the base level of the transistor $Q_{14}$ or $Q_{16}$ that is set for a reference level.

Figure 3:
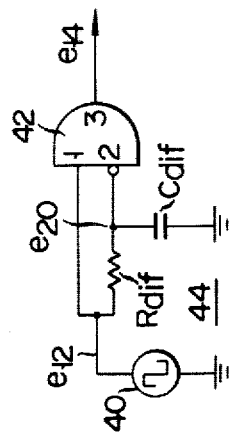
FIGS. 3 to 5 show equivalent circuits of a differentiation circuit 22 as shown in FIG. 1.
Figure 4:
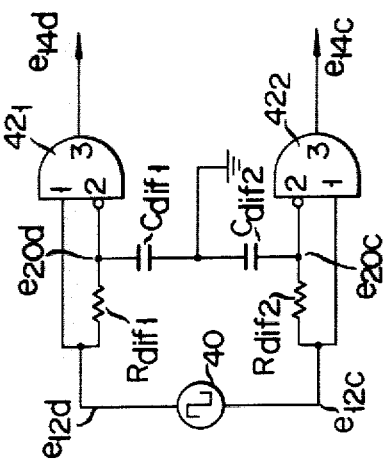
Figure 5:
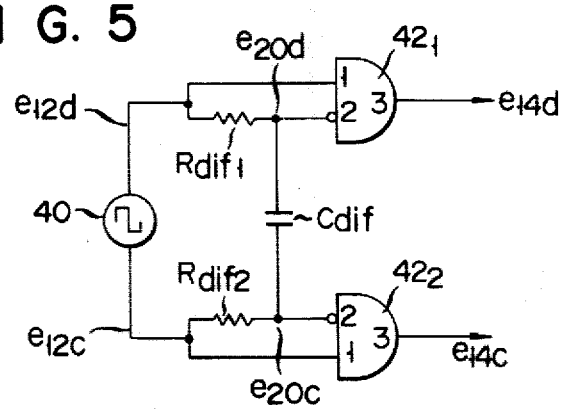

The differentiation circuit 22 including the differential logic circuit 21 may be represented by the equivalent circuits as shown in FIGS. 3 to 5. In FIG. 3, a square-wave signal source 40 corresponds to the limiter circuit 14. The square-wave signal $e_{12}$ derived from the signal source 40 is applied to a positive-phase input terminal 1 of an AND gate 42. The input terminal 1 corresponds to the base of the transistor $Q_{14}$, as in the differentiation circuit 22. Further, the signal $e_{12}$ is applied to a negative-phase input terminal 2 of the AND gate 42 through a resistor $R_{dif}$. The input terminal 2 is grounded through a capacitor $C_{dif}$. The resistor $R_{dif}$ corresponds to the resistor $R_{18}$ among others in the differentiation circuit 22. The resistor $R_{dif}$ and the capacitor $C_{dif}$ form an integration circuit or delay circuit 44. The input terminal 2 of the AND gate 42 corresponds to the base of the transistor $Q_{18}$, as in the differentiation circuit 22. Moreover, an output terminal 3 of the AND gate 42 corresponds to the collector of the transistor $Q_{16}$ or the terminal E.

Figure 6:
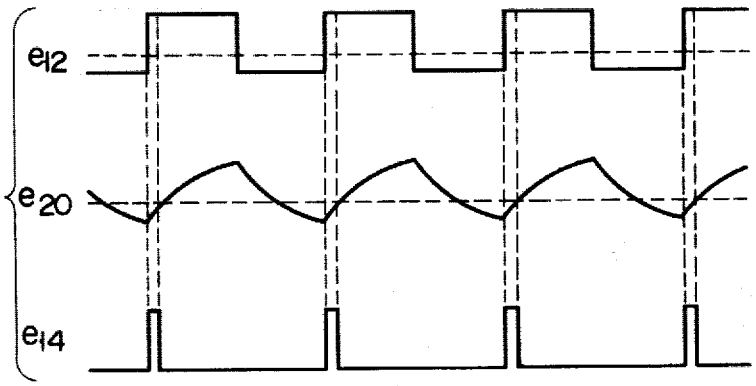
FIG. 6 shows waveforms for illustrating the operation of the equivalent circuit of FIG. 3.

The waveforms of FIG. 6 show the functions of the equivalent circuits as shown in FIG. 3. In FIG. 6, a horizontal broken line indicates the threshold level of the AND gate 42. When the square-wave signal $e_{12}$ is applied, the level of a signal $e_{20}$ applied to the input terminal 2 of the AND gate 42 rises gradually. The rising speed of the level of the signal $e_{20}$ is in inverse proportion to a time constant $R_{dif} \times C_{dif}$. The output terminal 3 of the AND gate 42 is at the high level only during a time since the signal $e_{12}$ gets at the high level until the level of the signal $e_{20}$ reaches the threshold level of the AND gate 42. As is apparent from FIG. 6, the signal $e_{14}$ provides a narrow pulse appearing at the beginning of the rise of the signal $e_{12}$. This pulse is used as the trigger pulse $e_{14}$ for triggering the MMV 32. The pulse width of the trigger pulse $e_{14}$ is proportional to the time constant $R_{dif} \times C_{dif}$. That is, the differentiation circuit 22 of FIG. 1, as represented by the equivalent circuit of FIG. 3, makes differentiating operation with the differential time constant $R_{dif} \cdot C_{dif}$.

FIG. 3 shows a case in which the signal source 40 is of an unbalanced type. Where the signal source 40 is balanced type, the differentiation circuit 22 may be represented by the equivalent circuit of FIG. 4. If capacitors $C_{dif1}$ and $C_{dif2}$ of FIG. 4 are thrown into one, and floated of the grounded circuit, there may be obtained the equivalent circuit as shown in FIG. 5. The correlation between the equivalent circuit of FIG. 5 and the differentiation circuit 22 of FIG. 1 is as follows. First and second input terminals of a first AND gate $42_1$ correspond to the bases of the transistors $Q_{14}$ and $Q_{18}$ respectively. Likewise, first and second input terminals of a second AND gate $42_2$ correspond to the bases of the transistors $Q_{16}$ and $Q_{20}$ respectively. The respective output terminals of the AND gates $42_1$ and $42_2$ correspond to the respective collectors of the transistors $Q_{16}$ and $Q_{14}$. Further, resistors $R_{dif1}$ and $R_{dif2}$ correspond to the resistors $R_{18}$ and $R_{20}$ respectively.

The circuit of FIG. 5 is substantially equivalent to the circuits of FIGS. 4 and 3. It is to be noted, however, that if the resistors $R_{dif}$, $R_{dif1}$ and $R_{dif2}$ are set at an equal resistance value, the smallest capacitance $C_{dif}$ in the case of FIG. 5 or 1 can be used to obtain the same time constant. This offers a considerable advantage in the formation of IC-type implementations of the circuits including the capacitance $C_{dif}$. Moreover, in the case of FIG. 5, a symmetrical signal voltage is applied across the capacitance $C_{dif}$, so that it is unnecessary to take account of the nonlinearity of the capacitance $C_{dif}$.

Now there will be described the operation of the MMV 32 with reference to the waveform of FIG. 7. First, with respect to the MMV 32 of FIG. 1, let us assume as follows:

(1) The negative power source $-V_{EE}$ is selected for the reference potential.

(2) The potential provided by the bias voltage source 30 is $E_1$.

(3) The serially added potential of the bias voltage sources 30 and 28 is $E_2$, which, however, is to be sufficiently lower (by several volts or more) than the potential at the positive power source $+V_{CC}$.

(4) The base-emitter threshold voltage of the transistors $Q_{22}$ to $Q_{26}$ is $V_{BE}$.

(5) The collector-emitter saturation voltage $V_{CE(SAT)}$ at a time when the transistors $Q_{22}$ to $Q_{26}$ are turned on is zero.

(6) $R_{24} < < Rt$. $Zi$ represents the input impedance of the transistor $Q_{26}$ and $Zi > > Rt$.

(7) The base potential of the transistor $Q_{26}$ is $E(t)$.

Figure 7:
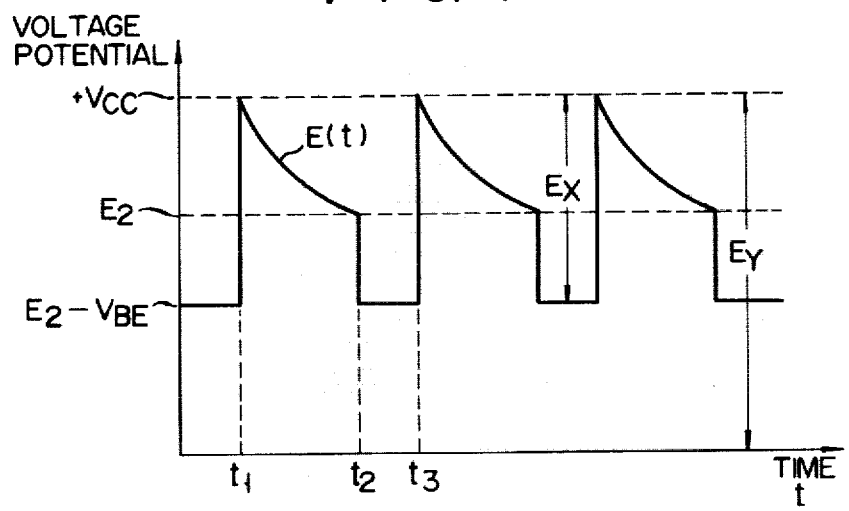
FIG. 7 shows a waveform for illustrating the operation of a monostable multivibrator 32 as shown in FIG. 1.

Referring to FIG. 7, before a time $t_1$, the transistor $Q_{24}$ is on, and the transistors $Q_{22}$ and $Q_{26}$ are off. An emitter potential $E_3$ of the transistor $Q_{24}$ equals $E_2 - V_{BE}$. At a time $t_1$, the trigger pulse $e_{14}$ is applied to the base of the transistor $Q_{22}$. The peak potential of the pulse $e_{14}$ must be higher than the potential $E_2$. Supplied with the pulse $e_{14}$, the transistor $Q_{22}$ is turned on. Let it be assumed that the levels of currents supplied from the current sources 24 and 26 are $I_{24}$ and $I_{26}$ respectively. Hereupon, there is given a relation $I_{24} = I_{26}$. (If $I_{24} \neq I_{26}$, however, the MMV 32 can operate.) Accordingly, when the transistor $Q_{22}$ is turned on, the current source 24 ceases to absorb the emitter current of the transistor $Q_{24}$. That is, when supplied with the pulse $e_{14}$, the transistor $Q_{24}$ is cut off.

Since it is assumed that $R_{24} < < Rt < < Zi$ (input impedance of $Q_{26}$), a collector potential $E_4$ of the transistor $Q_{24}$ is raised to the potential at the positive power source $+V_{CC}$ when the transistor $Q_{24}$ is cut off. At the initial stage of the increase of the potential $E_4$, the capacitor $Ct$ is not charged. Therefore, at the time $t_1$, the potential $E(t)$ is increased to the potential $+V_{CC}$. When the potential $E(t)$ is raised to the potential $+V_{CC}$, the emitter potential of the transistor $Q_{26}$ or the potential $E_3$ becomes equal to $V_{CC} - V_{BE}$. While $E(t) > E_2$, the base-emitter junction of the transistor $Q_{24}$ will not be forward biased. Accordingly, the transistor $Q_{24}$ is off while $E(t) > E_2$. As long as $E(t) > E_2$ transistor $Q_{24}$ continues to be off even though the pulse $e_{14}$ has disappeared and the transistor $Q_{22}$ has been cut off. Meanwhile, the transistor $Q_{26}$ is turned on.

After the time $t_1$, the capacitor $Ct$ is charged with a potential difference $Ex = E_4 - E_1 \simeq V_{CC} - E_1$. Thereupon, the potential $E(t)$ is subject to a change given as follows:

$$E(t) = (V_{CC} - E_1) \exp\left( -\frac{t}{Ct \cdot Rt} \right) \quad (1)$$

Referring again to FIG. 7, let us consider the potential $E(t_2)$ at a time $t_2$ where the time $t_1 = 0$. If $E(t_2) = E_2$, the transistor $Q_{24}$ is turned on at the time $t_2$. When the transistor $Q_{24}$ is turned on, the potential $E_4$ drops toward the potential equal to $E_2 - V_{BE}$ or the same level before the time $t_1$. Such drop of the potential $E_4$ is transmitted to the base of the transistor $Q_{26}$ through the capacitor $Ct$. That is, the potential $E(t)$ returns to the potential $E_2 - V_{BE}$ at the time $t_2$. Subsequently, when supplied with the trigger pulse $e_{14}$ at a time $t_3$, the potential $E(t)$ changes in the same way as in the interval of time from $t_1$ to $t_2$.

In FIG. 7, the time interval $t_2-t_1$ represents the operating time of the MMV 32. This operating time may freely be set by the time constant Ct.Rt. Further, the time interval $t_3-t_1$ represents the period of the trigger pulse $e_{14}$ which corresponds to the frequency of the FM input signal $e_{10}$. A signal with a phase opposite to that of the potential E(t) is obtained as the signal $e_{16}$ from the collector of the transistor $Q_{26}$. The ratio of the time interval $t_1$ to $t_2$ to the time interval $t_2$ to $t_3$, that is duty, changes in accordance with the period of the trigger pulse $e_{14}$. Accordingly, the signal $e_{16}$ becomes a pulse train whose duty changes with the frequency of the FM input signal $e_{10}$. (See the signal waveform $e_{16}$ of FIG. 2.)

One time operation of the MMV 32 is performed during a time since the trigger pulse $e_{14}$ is applied ($t=t_1$) until a relation $E(t)=E_2$ is obtained ($t=t_2$). Accordingly, as may be seen from eq. (1), the operation of the MMV 32 is determined when the potentials $E_1$, $E_2$ and $V_{CC}$ and the time constant Ct.Rt are fixed. That is, the operation of the MMV 32 is extremely stable if the voltages supplied from the voltage sources 28 and 30 and the potential difference between the positive and negative power sources $+V_{CC}$ and $-V_{EE}$ are constant, and if the values of the capacitor Ct and the resistance Rt are fixed. Thermal changes of the base-emitter voltage $V_{BE}$ of the transistors $Q_{22}$ to $Q_{26}$ constituting the MMV 32 will never affect the operating time of the MMV 32. This is one of the important advantages of this invention. The limiter circuit 14 and the differentiation circuit 22 are composed of differential circuits stabilized against temperature changes. Therefore, the FM demodulator circuit of FIG. 1, as a whole, may be so designed as to exhibit very high temperature-stability.

In the MMV 32, the current source 26 is inserted in the output load circuit of the transistor $Q_{26}$. The use of the current source 26 provides the following advantages.

Firstly, the upper amplitude limit of the output signal $e_{16}$ from the MMV 32 may be raised to a level close to the potential of the positive power source $+V_{CC}$. The lower amplitude limit of the signal $e_{16}$ is determined by the base potential $E_2$ of the transistor $Q_{24}$. The level of the potential $E_2$ may be set so that the level $E_2-V_{BE}$ enables the current source 24 to be operable. If the current source 24 is formed of a bipolar transistor, then the level of the potential $E_2$ at about 3 to 4 V may be quite enough. According to an experiment, when the positive power source $+V_{CC}$ was set at 16 V in a circuit arrangement of FIG. 8 as mentioned later, a level of 300 mV rms or higher was obtained for the output signal $e_{16}$.

Secondly, the output impedance of the MMV 32 at terminal F may be made very high. Then, the capacitor $C_{int}$ can be made smaller in determining a time constant $R_{26} \cdot C_{int}$ of the integration circuit 34. The time constant $R_{26} \cdot C_{int}$ is usually selected at 1 μsec or thereabout. Thus, the capacitor $C_{int}$ can be formed into an IC. If the resistor $R_{26}$ is of a high resistance value, however, it will be necessary to provide an impedance transformer circuit (buffer circuit) behind the terminal G in order to avoid influences of the input impedance of some other circuit connected to the terminal G.

FIG. 8 is a more detailed circuit diagram as compared with the schematic circuit diagram of FIG. 1. An FM signal source 10 is connected to a first input terminal A of the demodulator circuit through a DC blocking capacitor $C_{10}$, while a second input terminal B is grounded through a capacitor $C_{12}$. By AC-grounding the terminal B at the capacitor $C_{12}$, the demodulator circuit can handle unbalanced input signals. The terminals A and B are connected to the bases of NPN transistors $Q_{10}$ and $Q_{12}$ respectively. The bases of the transistors $Q_{10}$ and $Q_{12}$ are connected to the anode of a bias diode $D_{10}$ via resistors $R_{11}$ and $R_{13}$, respectively. The cathode of the diode $D_{10}$ is connected to the anode of a bias diode $D_{12}$, whose cathode is connected to a grounded circuit. The anode of the diode $D_{10}$ is connected to the emitter of an NPN transistor $Q_{19}$ through a resistor $R_{15}$. The emitters of the transistors $Q_{10}$ and $Q_{12}$ are connected to the grounded circuit through a resistor $R_{14}$. The collectors of the transistors $Q_{10}$ and $Q_{12}$ are connected to the emitter of the transistor $Q_{19}$ via resistors $R_{10}$ and $R_{12}$ respectively. The collector of the transistor $Q_{19}$ is connected to a positive power circuit ($+V_{CC}$).

The collector of the transistor $Q_{10}$ is connected to the bases of NPN transistors $Q_{11}$ and $Q_{16}$, while the collector of the transistor $Q_{12}$ is connected to the bases of NPN transistors $Q_{13}$ and $Q_{14}$. The collectors of the transistors $Q_{11}$ and $Q_{13}$ are connected to the emitter of the transistor $Q_{19}$. The emitters of the transistors $Q_{11}$ and $Q_{13}$ are connected to the anodes of level shift diodes $D_{20}$ and $D_{18}$ respectively. The cathodes of the diodes $D_{18}$ and $D_{20}$ are connected to the grounded circuit via resistors $R_{15}$ and $R_{17}$ respectively. The cathodes of the diodes $D_{18}$ and $D_{20}$ are connected also to the bases of NPN transistors $Q_{18}$ and $Q_{20}$ via resistors $R_{18}$ and $R_{20}$, respectively. The emitters of the transistors $Q_{18}$ and $Q_{20}$ are connected to the collector of an NPN transistor $Q_{17}$. The base and emitter of the transistor $Q_{17}$ are connected to the anode of the diode $D_{12}$ and the grounded circuit respectively. The collector of the transistor $Q_{20}$ is connected to the respective emitters of the transistors $Q_{14}$ and $Q_{16}$. The collector of the transistor $Q_{14}$ is connected to the emitter of an NPN transistor $Q_{15}$. The respective collectors of the transistors $Q_{16}$ and $Q_{18}$ are connected to the emitter of the transistor $Q_{15}$ through a resistor $R_{16}$. The collector of the transistor $Q_{15}$ is connected to the positive power circuit. The bases of the transistors $Q_{18}$ and $Q_{20}$ are connected with each other through a differentiation capacitor $C_{dif}$.

The collector of the transistor $Q_{16}$ is connected to the base of an NPN transistor $Q_{22}$. The emitter of the transistor $Q_{22}$, as well as the emitters of NPN transistors $Q_{24}$ and $Q_{26}$, is connected to the collector of an NPN transistor $Q_{27}$. The collectors of the transistors $Q_{22}$ and $Q_{26}$ are connected to the collector of a PNP transistor $Q_{21}$, whose emitter is connected to the positive power circuit. A resistor $R_{26}$ is connected between the collector and emitter of the transistor $Q_{21}$. The collector of the transistor $Q_{24}$ is connected to the positive power circuit through a resistor $R_{24}$. The base of the transistor $Q_{26}$ is connected to the emitter of an NPN transistor $Q_{23}$, whose collector is connected to the positive power circuit.

The base of the transistor $Q_{23}$ is connected to the anode of a bias diode block $D_{30}$, whose cathode is connected to the anode of a bias diode block $D_{32}$. The cathode of the diode block $D_{32}$ is connected to the grounded circuit. The anode of the diode block $D_{30}$ is connected with the cathode of a bias diode block $D_{34}$, whose anode is connected to the positive power circuit through a resistor $R_{23}$. The anode of the diode block $D_{34}$ is connected with the base of the transistor $Q_{15}$, while the anode of the diode block $D_{30}$ is connected with the bases of the transistors $Q_{24}$ and $Q_{19}$. Here let it be assumed that the base-emitter voltage of the transistors $Q_{15}$ and $Q_{19}$ is $V_{BE}$, the anode voltage of the diode block $D_{30}$ is $V_2$, and the anode voltage of the diode block $D_{34}$ is $V_3$. In this case, the emitter voltage of the transistor $Q_{19}$ or the positive supply voltage $+V_{CC1}$ of the limiter circuit 14 becomes equal to $V_2-V_{BE}$. Likewise, the emitter voltage of the transistor $Q_{15}$ or the positive supply voltage $+V_{CC2}$ of the differentiation circuit 22 becomes equal to $V_3-V_{BE}$. The transistors $Q_{15}$ and $Q_{19}$ and the diode blocks $D_{30}$ to $D_{34}$ form a stabilized power circuit of simple construction. Further, the anode of the diode block $D_{32}$ is connected with the bases of NPN transistors $Q_{28}$ and $Q_{29}$ as well as the base of the transistor $Q_{27}$.

The emitters of the transistors $Q_{27}$, $Q_{28}$ and $Q_{29}$ are connected to the grounded circuit via resistors $R_{27}$, $R_{28}$ and $R_{29}$ respectively. The collector of the transistor $Q_{28}$ is connected with the cathode of a bias diode $D_{35}$ and the base of the transistor $Q_{21}$. The anode of the diode $D_{35}$ is connected to the positive power circuit. The collector of the transistor $Q_{29}$ is connected to the positive power circuit through a resistor $R_{25}$. The collector of the transistor $Q_{24}$ is connected with the base of an NPN transistor $Q_{25}$. The collector of the transistor $Q_{25}$ is connected to the positive power circuit, while the emitter of the transistor $Q_{25}$ is connected to a terminal J which is grounded through a resistor $R_{21}$. The base of the transistor $Q_{26}$ is connected to a terminal K. The terminals J and K are connected with each other through a capacitor Ct, the terminal K being grounded via a resistor Rt.

The collector of the transistor $Q_{26}$ is connected to the base of an NPN transistor $Q_{30}$ and a terminal L. The collector of the transistor $Q_{29}$ is connected to the base of an NPN transistor $Q_{31}$. The collectors of the transistors $Q_{30}$ and $Q_{31}$ are connected to the positive power circuit, while their emitters are connected to the grounded circuit via resistors $R_{30}$ and $R_{31}$ respectively. Further, the emitters of the transistors $Q_{30}$ and $Q_{31}$ are connected to terminals G and H respectively. The terminal G is connected to the terminal H through a series circuit of a resistor $R_{32}$ and a capacitor $C_{14}$ and also through a series circuit of a resistor $R_{33}$ and a tuning meter 46. The tuning meter 46 is connected in parallel with a capacitor $C_{16}$. The terminal L is grounded through an integration capacitor $C_{int}$. The positive power circuit is connected to a positive power source $+V_{CC}$ through a terminal M, while the grounded circuit is grounded via a terminal N.

A demodulated AF signal $e_{18}$ is taken out through the terminal G. A control signal $e_{20}$ for AFC (automatic frequency control) is taken out from the connection point of the resistor $R_{32}$ and the capacitor $C_{14}$. The signal $e_{20}$ is a DC component of the signal $e_{18}$, varying in accordance with the frequency of the FM input signal $e_{10}$.

The correspondence of FIG. 8 to FIG. 1 should be understood from those common reference numerals. In order to make such correspondence clearer, however, there will be given an additional explanation as follows. The current source 12 of FIG. 1 is substituted by a mere resistor $R_{14}$ in FIG. 8, which as a practical matter, performs adequately. Such substitution of the resistor $R_{14}$ for the current source 12 provides the following advantage. A resistance element formed by diffusion in an IC is susceptible to errors as compared with a predetermined value (design value). These errors are usually as high as approximately ±20%. However, the absolute value of a relative error in the same IC can be held down to a few percent. Accordingly, the relative error of the resistor $R_{14}$ as compared with the resistors $R_{10}$ and $R_{12}$ can be reduced to a sufficiently low level. Then, variation of the collector voltage of the transistors $Q_{10}$ and $Q_{12}$ from the design value may be limited to the minimum possible size. This will produce an effect to reduce variations in the operating points of the differentiation circuit 22 directly connected to the collector circuit of the transistors $Q_{10}$ and $Q_{12}$.

The level shift voltage source 18 corresponds to the transistor $Q_{13}$ and the diode $D_{18}$. The sum of the base-emitter voltage $V_{BE}$ of the transistor $Q_{13}$ and a forward voltage drop $V_F$ of the diode $D_{18}$, that is $V_{BE}+V_F$, becomes the level shift voltage. Similarly, the level shift voltage source 20 corresponds to the transistor $Q_{11}$ and the diode $D_{20}$. The transistors $Q_{11}$ and $Q_{13}$ function also as an impedance buffer circuit for the base circuit of the transistors $Q_{18}$ and $Q_{20}$.

The current source 16 corresponds to the transistor $Q_{17}$. The current source 16 can be replaced with a mere resistor, which, however, is not desirable. Since the differentiation circuit 22 operates digitally, it has no such advantage as mentioned with respect to the resistor $R_{14}$ of the limiter circuit 14. On the contrary, it is subject to a striking defect to deteriorate the CMRR (common mode rejection ratio) of a differential circit consisting of the transistors $Q_{18}$ and $Q_{20}$.

The bias voltage source 28 in the MMV 32 corresponds the base-emitter voltage $V_{BE}$ of the transistor $Q_{23}$. A series circuit of the bias voltage sources 28 and 30 corresponds to a series circuit of the diode blocks $D_{30}$ and $D_{32}$. Here let us suppose that a forward voltage drop per diode element is $V_F$. The numbers of diode elements included in the diode blocks $D_{30}$ and $D_{32}$ are 4 and 2 respectively. Thereupon, when the transistor $Q_{23}$ is in conduction, the base potential of the transistor $Q_{26}$ equals $6V_F-V_{BE}$. This potential corresponds to the potential $E_1$ provided by the voltage source 30. The potential $E_2$ in the MMV 32 corresponds to $6V_F$.

The current sources 24 and 26 correspond to the transistors $Q_{21}$ and $Q_{27}$. A supply current $I_{24}$ from the current source 24 may be set at an optional level according to the resistance value of the resistor $R_{27}$, while a supply current $I_{26}$ from the current source 26 may be changed with the resistance value of the resistor $R_{28}$.

In connection with the description of the MMV 32, it was assumed that $R_{24}<<Rt$. This assumption can be realized by inserting an emitter follower formed of the transistor $Q_{25}$ between the collector of the transistor $Q_{24}$ and the capacitor Ct.

It is to be noted that FIG. 8 differs from FIG. 1 in the connection of the resistor Rt. The MMV 32 as shown in FIG. 1 is deliberately simplified as an aid in understanding its basic operation. In FIG. 8, one end of the resistor Rt is grounded. With respect to the basic operation as a monostable multivibrator, the cases of FIGS. 1 and 8 are the same. As for the parameter to determined the operating time for the case of FIG. 8, however, it is different from that of eq. (1). There will now be given an analytical explanation of the MMV of FIG. 8.

Before the trigger pulse $e_{14}$ is applied to the switch transistor $Q_{22}$, the transistors $Q_{26}$ and $Q_{24}$ are off and on respectively. Since the constant current $I_{24}$ always flows through the transistor $Q_{27}$, there is caused at the resistor $R_{24}$ a voltage drop represented by $R_{24}\cdot I_{24}$. At this time, the collector potential of the transistor $Q_{24}$ is to be higher than its emitter potential. That is, the onstate transistor $Q_{24}$ is to be unsaturated. When the transistor $Q_{24}$ is supplied with the trigger pulse $e_{14}$ to be cut off, the voltage drop $R_{24}.I_{24}$ caused by the resistor $R_{24}$ is reduced to zero. That is, the moment the pulse $e_{14}$ is applied, the potentials at the terminals J and K increase by $R_{24}.I_{24}$. Then, the transistor $Q_{26}$ is turned on, while the transistor $Q_{26}$ maintains the off state. At this time, the base-emitter junction of the transistor $Q_{23}$ is biased in the reverse direction, and the base-emitter junction of the transistor $Q_{23}$ becomes nonconducting. Thereupon, a steady-state potential difference applied to a CR discharge circuit composed of the capacitor Ct and the resistor Rt equals the base potential of the transistor $Q_{26}$ immediately before the supply of the pulse $e_{14}$ plus the voltage drop $R_{24}.I_{24}$.

As mentioned above, the base potential of the transistor $Q_{26}$ is $6V_F - V_{BE}$. If $V_F = V_{BE}$, the base potential of the transistor $Q_{26}$ is $5V_{BE}$. Accordingly, a potential difference EY applied to discharge circuit consisting of the capacitor Ct and the resistor Rt is $$EY = R_{24} \cdot I_{24} + 5V_{BE} \text{ (cf. FIG. 7)} \quad (2)$$

Meanwhile, if the base-emitter voltage $V_{BE \, of \, the \, transistor \, Q_{27}}$ is also equal to $V_F$ for each element of the diode block $D_{32}$, the collector current $I_{24}$ of the transistor $Q_{27}$ is $$I_{24} = (2V_F - V_{BE})/R_{27} = V_{BE}/R_{27} \quad (3)$$

From eqs. (2) and (3), there is obtained $$EY = (R_{24}/R_{27} + 5)V_{BE} \quad (4)$$

Applying eq. (4) to eq. (1), we obtained $$E(t) = (R_{24}/R_{27} + 5)V_{BE} \cdot \exp\left(-\frac{t}{CtRt}\right) \quad (5)$$

On the other hand, the base potential $E_2$ of the transistor $Q_{24}$ is given as follows:

$$E_2 = 6V_F = 6V_{Be} \quad (6)$$

As described in connection with the MMV 32 of FIG. 1, the ending time of the operation of the MMV of FIG. 8 is also determined by $E(t) = E_2$. Therefore, the operating time of the MMV may be obtained by taking eqs. (5) and (6) with an equal mark. That is, $$6V_{BE} = (R_{24}/R_{27} + 5)V_{BE} \cdot \exp\left(-\frac{t}{CtRt}\right)$$

Eliminating $V_{BE}$ from this equation, we obtain a time t as follows:

$$t = Ct \cdot Rt \ln\left(\frac{R_{24}R_{27} + 5}{6}\right) \quad (7)$$

Eq. (7) indicates that the operating time of the MMV as shown in FIG. 8 is determined by a time constant CtRt and a resistance ratio $R_{24}/R_{27}$. As described in connection with the resistor $R_{14}$, the resistance ratio $R_{24}/R_{27}$ can exactly be determined in forming an IC-type version. If the circuit is converted into IC-type, the temperature coefficients of the resistors $R_{24}$ and $R_{27}$ may be made substantially equal, and their thermal coupling capability is highly satisfactory. Accordingly, the variation in the operating time of the MMV can be minimized by only limiting the variation in the time constant CtRt. Moreover, if the temperature-induced change of the time constant CtRt is checked, the temperature-induced change of the operating time or output pulse width of the MMV may be reduced to the minimum degree.

There may be given two means for restraining temperature-induced changes of the time constant CtRt. One such means is to use, for the capacitor Ct, a capacitor having a temperature coefficient with the opposite sign to that of the temperature coefficient of the resistor Rt. When the resistance value of the resistor Rt is increased by 1% by a temperature rise of 10° C., for example, the temperature-induced change of the time constant CtRt may be cancelled by using for the capacitor Ct one whose capacitance will be reduced by 1% in response to the 10° C. temperature rise. The other means is to use ones with small temperature coefficients for the resistor Rt and the capacitor Ct. For example, the temperature-induced change of the time constant CtRt may be reduced to an extremely small value by employing a metal film resistor and a mica condenser for the resistor Rt and the capacitor Ct respectively.

A demodulated output $e_{16}$ of the circuit as shown in FIG. 8 is equal to a value obtained by averaging the voltage drop at the resistor $R_{26}$ by means of time. That is, the modulated output $e_{16}$ is in proportion to the product of an operating time t of the MMV and an output amplitude $E_{16}$ of the MMV. Namely, we obtain $$e_{16} = K \cdot t \cdot E_{16} \quad (8)$$

Here K is a proportional constant. A current change caused at the collector circuit of the transistor $Q_{26}$ when the transistor $Q_{26}$ is turned off is equal to the collector current $I_{24}$ of the transistor $Q_{27}$. Accordingly, the output amplitude $E_{16}$ becomes $$E_{16} = R_{26} \cdot I_{24} \quad (9)$$

Substituting eq. (3) into eq. (9), we have $$E_{16} = (R_{26}/R_{27})V_{BE} \quad (10)$$

According to eqs. (8) and (10), we obtain $$e_{16} = (R_{26}/R_{27})k \cdot t \cdot V_{BE} \quad (11)$$

As described before, in converting the circuit into an IC-type version, the temperature-induced changes of the resistance ratio $R_{26}/R_{27}$ and the operating time t of the MMV may be minimized. However, $V_{BE}$ has a temperature coefficient of about $-2$ mV/°C. Therefore, the demodulated output $e_{16}$ should have a temperature coefficient of $-3,000$ ppm/°C. or thereabout.

A thermal drift of the demodulated output $e_{16}$ would shift the tuning point on the tuning meter. Moreover, if the DC component of the demodulated output $e_{16}$ is utilized for the AFC signal $e_{20}$, the thermal drift will go so far as to change the tuning frequency of a tuner. The circuit of FIG. 8 includes an arrangement for compensating the thermal drift. The demodulated output $e_{16}$ is led to the terminal G through the transistor $Q_{30}$. On the other hand, the terminal H is connected to the collector of the transistor $Q_{29}$ through the transistor $Q_{31}$. A collector potential $E_{29}$ of the transistor $Q_{29}$ is given by the product of the resistance value of the resistor $R_{25}$ and the collector current $I_{29}$ of the transistor $Q_{29}$. The collector current $I_{29}$ may be obtained in the same way as eq. (3). That is, we obtain $$E_{29} = R_{25} \cdot I_{29} \text{ and} \tag{12}$$

$$I_{29} = V_{BE}/R_{29} \tag{13}$$

From eqs. (12) and (13), we have $$E_{29} = (R_{25}/R_{29})V_{BE} \tag{14}$$

Substituting eq. (7) into eq. (11) and then subtracting eq. (14) from the resultant equation, we obtain $$e_{16} - E_{29} = (R_{26}/R_{27})kCtRt\ln\left(\frac{R_{24}/R_{27} + 5}{6}\right)V_{BE} - (R_{25}/R_{29})V_{BE} = \left\{\frac{R_{26}}{R_{27}} kCtRt\ln\left(\frac{R_{24}/R_{27} + 5}{6}\right) - \frac{R_{25}}{R_{29}}\right\} V_{BE} \tag{15}$$

According to eq. (15), if $$\frac{R_{26}}{R_{27}} kCtRt\ln\left(\frac{R_{24}/R_{27} + 5}{6}\right) = \frac{R_{25}}{R_{29}} \tag{16}$$

is satisfied, a potential difference $e_{16} - E_{29}$ will become zero. Partially differentiating eq. (16) by a temperature T, if $$\frac{\partial}{\partial t}\left\{\frac{R_{26}}{R_{27}} kCtRt\ln\left(\frac{R_{24}/R_{27} + 5}{6}\right)\right\} = \frac{\partial}{\partial t}\left(\frac{R_{25}}{R_{29}}\right) \tag{17}$$

is satisfied, the temperature-induced change of the potential difference $e_{16} - E_{29}$ also becomes zero.

If the respective temperature coefficients of $R_{26}/R_{27}$, CtRt, $R_{24}/R_{27}$ and $R_{25}/R_{29}$ in eq. (17) are all zero, eq. (17) is fulfilled. If a mica condenser and a metal film resistor are used for Ct and Rt respectively and resistors with the same temperature coefficient are employed as $R_{24}$ to $R_{27}$ and $R_{29}$, then the relation of eq. (17) may practically be realized. That is, by designing and adjusting the circuit of FIG. 8 so that eqs. (16) and (17) are fulfilled, the potential difference between the terminals G and H may be reduced to zero, and also the thermal drift of the AFC signal $e_{20}$ obtained from between the terminals G and H may be reduced substantially to zero. The thermal drift cancellation effect will be particularly satisfactory if the circuit enclosed by a broken line as in FIG. 8 is formed into a one-chip IC.

FIG. 9 is a circuit diagram similar to the circuit arrangement as shown in FIG. 8, part of which is modified. Now there will be given an explanation of the circuit, laying stress on such modified part. Transistors $Q_{26a}$ and $Q_{26b}$ form an inverted Darlington circuit. By this Darlington connection, an input impedance near the threshold, as taken from the base of the transistor $Q_{26a}$, is increased by a large margin. This means that the resistor Rt can be set at a high value. Then, if the time constant CtRt is fixed, the capacitor Ct may be reduced. For the capacitor Ct, an expensive mica condenser is usually employed. Generally, the price of the mica condenser is reduced as its capacitance is lowered. In adapting the circuit of FIG. 9 into an IC, an increase in cost brought about by the addition of the transistor $Q_{26b}$ to the transistor $Q_{26a}$ is substantially negligible. The cost of an IC is determined mainly by its chip size, so that a moderate increase in the number of circuit elements does not appreciably affect the cost.

In FIG. 9, an NPN transistor $Q_{32}$ is used instead of the bias diode $D_{32}$ used in the circuit configuration of FIG 8. The collector and base of the transistor $Q_{32}$ are connected to the base and emitter of the transistor $Q_{27}$ respectively. The emitter of the transistor $Q_{32}$ is grounded. A collector current $I_{24}$ of the transistor $Q_{27}$ is equal to a value obtained by dividing a base-emitter voltage $V_{BE}$ of the transistor $Q_{32}$ by the resistance $R_{27}$. That is, eq. (3) holds also with respect to the circuit arrangement of FIG. 9. The collector voltage of the transistor $Q_{32}$ equals the sum of the respective base-emitter voltages of the transistors $Q_{27}$ and $Q_{32}$, that is $2V_{BE}$.

A base potential $E_2$ of the transistor $Q_{23}$ equals the sum of $2V_{BE}$ and a level shift voltage or Zener voltage Vz provided by an NPN transistor $Q_{34}$. That is, we obtain $$E_2 = Vz + 2V_{BE} \tag{18}$$

Having its emitter-base region biased in the reverse direction, the transistor $Q_{34}$ is used in a primary breakdown state. Namely, the transistor $Q_{34}$ is equivalent to a Zener diode. If the Zener voltage Vz is at approximately 5 V or higher, its temperature coefficient $\partial Vz/\partial T$ is positive. On the other hand, the temperature coefficient $\partial(2V_{BE})/\partial T$ of the base-emitter voltage $2V_{BE}$ is negative. Accordingly, the temperature-induced change of the potential $E_2$ may be reduced substantially to zero by suitably selecting the carrier concentration of the emitter region of the transistor $Q_{34}$.

The transistor $Q_{21}$ is biased by the emitter-base pass of a diode-connected PNP transistor $Q_{35}$. The transistor $Q_{35}$ corresponds to the bias diode $D_{35}$ of FIG. 8. The transistors $Q_{21}$ and $Q_{35}$ form a current mirror circuit. That is, the collector current $I_{26}$ of the transistor $Q_{21}$ is equal to a collector current $I_{35}$ of the transistor $Q_{35}$. The collector of the transistor $Q_{35}$ is connected to the respective collectors of NPN transistors $Q_{28}$ and $Q_{36}$. The emitter of the transistor $Q_{28}$ is connected to the grounded circuit through the resistor $R_{28}$, while the emitter of the transistor $Q_{36}$ is directly connected to the grounded circuit. The current $I_{35}$ is branched into collector currents $I_{28}$ and $I_{36}$ of the transistors $Q_{28}$ and $Q_{36}$.

$$I_{26} = I_{35} = I_{28} + I_{36} \tag{19}$$

The current $I_{36}$ which is one for DC NF, is selected to be much smaller than the current $I_{28}$. From eq. (19), therefore, we obtain $$I_{26} = I_{35} \approx I_{28} \tag{19A}$$

Thus, the thermal characteristics of the currents $I_{26}$ and $I_{35}$ are substantially the same as that of the current $I_{28}$. The collector current $I_{28}$ is equal to a value obtained by dividing $V_{BE}$ by the resistance $R_{28}$ which value of the $V_{BE}$ is obtained by subtracting the base-emitter potential $V_{BE}$ of the transistor $Q_{28}$ from the collector potential $2V_{BE}$ of the transistor $Q_{32}$. Namely, $$I_{28} = V_{BE}/R_{28} \tag{20}$$

Since the base circuit of the transistor $Q_{36}$ is driven by a constant current source as mentioned later, term $V_{BE}$ is not included in the collector current $I_{36}$, practically. Accordingly, from eqs. (19A) and (20), we obtain $$I_{26} = V_{BE}/R_{28} \tag{21}$$

As may be clarified by comparing eq. (21) with eq. (3), both the currents $I_{24}$ and $I_{26}$ include $V_{BE}$ as a parameter, so that the temperature coefficients of the currents $I_{24}$ and $I_{26}$ may be set at substantially the same degree.

In the circuit arrangement of FIG. 9, there is provided a DC negative feedback loop for stabilizing the operating points of DC-type circuits and reducing the thermal drift. The emitters of the transistors $Q_{30}$ and $Q_{31}$ are connected to the bases of PNP transistors $Q_{39}$ and $Q_{40}$ through resistors $R_{35}$ and $R_{36}$, respectively. The bases of the transistors $Q_{39}$ and $Q_{40}$ are connected to terminals O and P respectively. The terminals O and P are alternatingly shorted by a capacitor $C_{18}$. The respective emitters of the transistors $Q_{39}$ and $Q_{40}$ are connected to the positive power circuit through a resistor $R_{37}$. The resistor $R_{37}$ may be replaced by a constant-current source. The collectors of the transistors $Q_{39}$ and $Q_{40}$ are connected to the collectors of NPN transistors $Q_{41}$ and $Q_{42}$ respectively. The respective emitters of the ransistors $Q_{41}$ and $Q_{42}$ are connected to the grounded circuit. The collector of the transistor $Q_{42}$ is connected to the respective bases of the transistors $Q_{41}$ and $Q_{42}$, while the collector of the transistor $Q_{41}$ is connected to the base of the transistor $Q_{36}$. The base of the transistor $Q_{36}$ is constant-current-driven by the collectors of the transistors $Q_{39}$ and $Q_{41}$. Thus, $I_{36}$ of eq. (21) bears no relation to $V_{BE}$ of the transistor $Q_{36}$.

The DC component of the demodulated output $e_{16}$ appearing at the base of the transistor $Q_{30}$ is negatively fed back to the collector circuit of the transistor $Q_{21}$ via transistors $Q_{30}$, $Q_{39}$ to $Q_{42}$, $Q_{36}$, $Q_{35}$ and $Q_{21}$. In this negative feedback loop, the AC component of the demodulated output $e_{16}$ is cancelled by the capacitor $C_{18}$. That is, the transfer function of the negative feedback loop is large enough only within a frequency range near DC, whereas it is very small above the audio frequency band (about approx. 20 Hz). If this negative feedback effectively acts on the AC component, the MMV 32 is prevented from normal operation.

For a comparison potential to be the operation reference of the negative feedback loop, the potential at the emitter of the transistor $Q_{31}$ or the terminal H is used. If the DC potential at the terminal H varies, the potential at the emitter of the transistor $Q_{30}$ or the terminal G may always be kept at the same level with the potential of the terminal H. Accordingly, the base circuit of the transistor $Q_{31}$ need not be specially thermally compensated. Meanwhile, the potential at the terminal H may be kept constant as against the grounded circuit by providing a bias circhuit such that the emitter potential of the transistor $Q_{31}$ becomes constant. NPN transistors $Q_{29a}$ and $Q_{29b}$ interposed between the resistor $R_{25}$, as well as the base of the transistor $Q_{31}$, and the grounded circuit form such bias circuit. The diode-connected transistor $Q_{29a}$ is intended for the temperature-compensation of $V_{BE}$ of the transistor $Q_{31}$. The emitter-region carrier concentration of the Zener-diode-connected transistor $Q_{29b}$ is so set as to reduce its temperature coefficient substantially to zero.

FIG. 9 suggests the intention of converting the integration capacitor $C_{int}$ into an IC-type version. The base of the transistor $Q_{30}$ is driven by the collector circuit of the transistor $Q_{21}$ and $Q_{22}$ or $Q_{26a}$. The transistor $Q_{30}$ is apparently driven by the emitter of the transistor $Q_{26b}$. Practically, however, the emitter of the transistor $Q_{26b}$ is equivalent to the collector of the inverted-Darlington-connected transistor $Q_{26a} + Q_{26b}$. Thus, the base circuit impedance of the transistor $Q_{30}$ is extremely high. Accordingly, the capacitance of the integration capacitor $C_{int}$ may greatly be reduced by increasing the input impedance of the transistor $Q_{30}$ itself. In order to increase the input impedance of the transistor $Q_{30}$, a kind of inverted Darlington circuit is applied also to the transistor $Q_{30}$. The collector of the transistor $Q_{30}$ is connected to the base of NPN transistors $Q_{37}$ and $Q_{38}$. The collectors of the transistors $Q_{37}$ and $Q_{38}$ are connected to the emitter and collector of the transistor $Q_{30}$ respectively. The respective emitters of the transistors $Q_{37}$ and $Q_{38}$ are connected to the positive power circuit. The transistors $Q_{37}$ and $Q_{38}$ form a current mirror circuit, and the transistors $Q_{30}$ and $Q_{37}$ are inverted-Darlington-connected. For the transistor $Q_{30}$, an ordinary Darlington connection or FET may be employed. As regards the supply voltage utilization factor, however, the inverted Darlington connection secures the most satisfactory result.

The capacitor $C_{int}$ is connected to the base of the transistor $Q_{30}$ and the positive power circuit. One end of the capacitor $C_{int}$ may be connected to some other circuit than the positive power circuit. For example, the capacitor $C_{int}$ may be connected between the base and collector of the transistor $Q_{30}$. In this case, a junction capacitance Cob between the collector and base of the transistor $Q_{30}$ can be used for the capacitor $C_{int}$.

In FIG. 9, the transistors $Q_{26a}$ and $Q_{26b}$, as well as $Q_{30}$ and $Q_{37}$, are Darlington-connected. This is done as a mere possibility, and such Darlington connection can normally be omitted if the current amplification factors of the transistors $Q_{26}$ and $Q_{32}$ are large enough. This Darlington connection is effective, however, when applying this invention to FM amplifier circuits of a kind that requires a larger time constant.

Figure 9A:
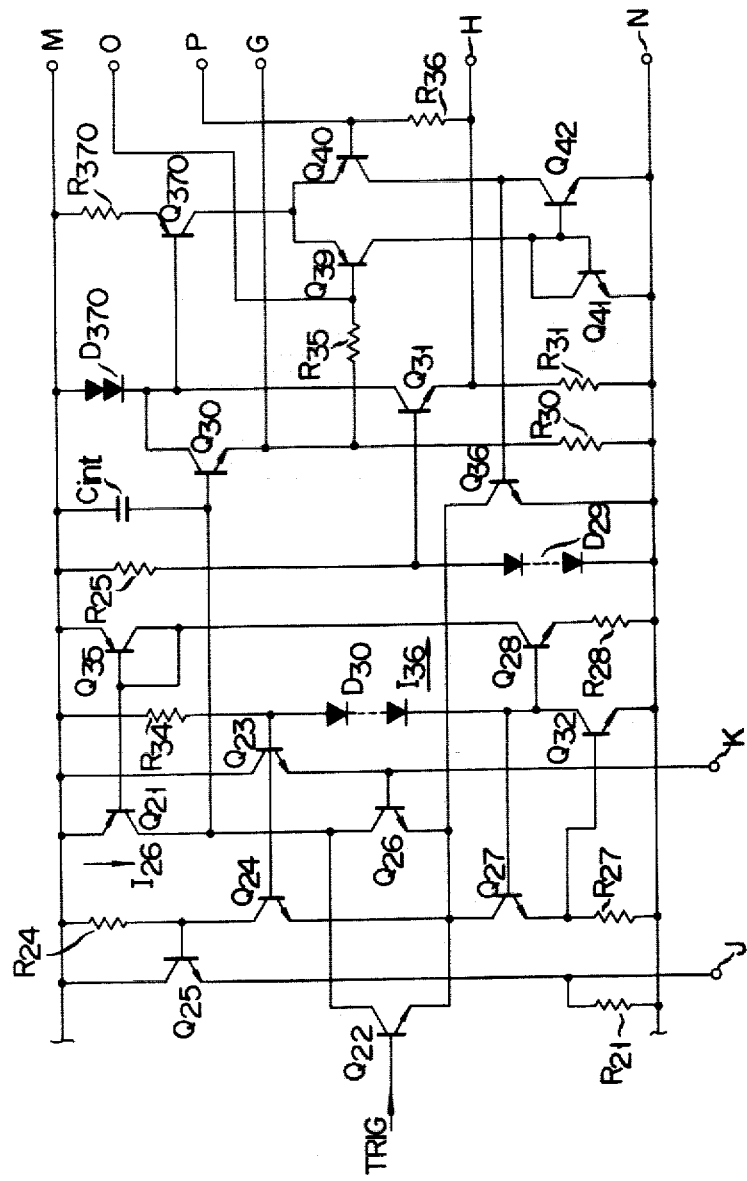
FIG. 9A shows a modification of the circuit diagram of FIG. 9.

FIG. 9A is a circuit diagram similar to the circuit arrangement as shown in FIG. 9, part of which is modified. In FIG. 9A, the DC negative feedback for the aforesaid thermal drift reduction is returned to the current source 24 or the collector circuit of the transistor $Q_{27}$. In the case of the DC negative feedback shown in FIG. 9, the transistor $Q_{21}$ is so operated as to reduce its collector current $I_{26}$ when the potential of the terminal G is increased higher as compared with the terminal H. In the case of the DC negative feedback shown in FIG. 9A, however, the supply current $I_{24}$ of the current source 24 is caused to increase apparently when the potential of the terminal G is increased higher than that of the terminal H. That is, the collector current $I_{36}$ of the transistor $Q_{36}$ is increased by the potential increase at the terminal G. The apparent supply current $I_{24}$ of the current source 24 equals the sum of the respective collector currents of the transistors $Q_{27}$ and $Q_{36}$.

In FIG. 9A, a constant-current circuit consisting of a diode block $D_{370}$, a resistor $R_{370}$ and a PNP transistor $Q_{370}$ corresponds to the resistor $R_{37}$ of FIG. 9. Likewise, diode blocks $D_{30}$ and $D_{29}$ correspond to the transistors $Q_{34}$ and $Q_{29a} + Q_{29b}$ respectively.

FIGS. 10 to 12 show examples of structures for converting the differentiation capacitor $C_{dif}$ or the integration capacitor $C_{int}$ into an IC-type version. FIG. 10 shows an arrangement in which two PN junction diode structures are parallel-connected in a staggered manner. In applying this staggered parallel capacitor, however, it will conduct if the potential difference across it is large (approx. 0.5 V or higher). Therefore, attention should be paid to the circuit voltage distribution in the design procedure. N regions 100 and 108 of a first diode structure are connected to a P region 106 of a second diode structure. N regions 102 and 110 of the second diode structure are connected to a P region 104 of the first diode structure. The N regions 108 and 110 are connected to terminals a and b respectively, the capacitor $C_{dif}$ or $C_{int}$ being formed between the terminals a and b. The first purpose for such staggered parallel connection is to compensate the nonlinearity of the capacitance. That is, by the staggered construction, a capacitance with +0.1 volt applied to the terminal b and a capacitance with −0.1 volt applied to the terminal b may be caused to coincide, with the terminal a as a base. The second intention is to obtain a large capacitance. In utilizing a PN junction, higher capacitance may be obtained with lower applying voltage. In order positively to obtain a small capacitance after compensating the nonlinearity, however, a staggered series connection as shown in FIG. 11 should be made. This corresponds to the case where the input capacitances of the transistors $Q_{18}$ and $Q_{20}$ are utilized with reference to FIG. 8. (there two cases differ in construction, however). The capacitance in the structure of FIG. 11 is about ½ to ¼ of the capacitance in the structure of FIG. 10.

FIG. 12 shows an example of arrangement in which capacitances between the gate and source or the gate and drain of a MOS transistor are parallel-connected in a staggered manner. That is, a gate 120 of a first structure and a source (or drain) 126 of a second structure are connected to a terminal a. On the other hand, a gate 122 of the second structure and a source (or drain) 124 of the first structure are connected to a terminal b. A compensating diffusion layer 128 and a separating diffusion layer 130 are provided for the removal of interactions between the first structure and the second structure, and between the first and second structures and other circuit elements.

The demodulator circuit according to this invention is not limited to demodulation of FM waves, but is widely applicable as a DA converter circuit.

Although, in the circuits as shown in FIGS. 1, 8 and 9, bipolar transistors are used as active elements, they may be replaced by other types of elements such as FET's.

Although specific circuit constructions have been illustrated and described herein, it is not intended that the invention be limited to the elements and circuit constructions disclosed. One skilled in the art will recognize that the particular elements or subcircuits may be used without departing from the scope and spirit of the invention.

What is claimed is:

1. A demodulator circuit comprising:
    a limiter circuit for providing a first signal corresponding only to the frequency component of an input signal,
    a differentiation circuit for providing a trigger pulse synchronized with said first signal,
    a vibrator circuit triggered by said trigger pulse for providing a second signal the duty of which is varied in accordance with the frequency of said trigger pulse, and
    an integration circuit for providing an output signal having a level corresponding to the duty of said second signal;
    said differentiation circuit including an AND gate circuit and a delay circuit;
    said first signal being applied to a first input terminal of said AND gate circuit and to said delay circuit;
    a second input terminal of said AND gate circuit being supplied with a third signal from said delay circuit; and
    said AND gate circuit providing said trigger pulse by detecting the logical sum of a first logic level of said first signal and a second logic level corresponding to the logic level of said third signal.

2. A demodulator circuit according to claim 1 wherein said vibrator circuit comprises a switch transistor the base of which is supplied with said trigger pulse;
    a first transistor the emitter of which is connected to the emitter of said switch transistor, the base of which is supplied with a first potential, and the collector of which is connected to a first voltage source through a first resistor;
    a second transistor the emitter of which is connected to the emitter of said switch transistor, the base of which is connected to the collector of said first transistor through a first capacitor and to a zero AC potential circuit through a second resistor, the base of said second transistor being supplied with a second potential such that said second transistor is turned off when said first transistor is turned on, and the collector of which is connected to the collector of said switch transistor, said second signal being delivered from the collector of said second transistor;
    a first current source connected between said first voltage source and the collector of said second transistor to supply a first current; and a second current source connected between the emitter of said second transistor and a second voltage source to supply a second current.

3. A demodulator circuit according to claim 1 or 2 wherein said delay circuit comprises a third resistor having one end supplied with a first phase of said first signal and the other end delivering a third phase of said third signal;
    a fourth resistor having one end supplied with a second phase of said first signal and the other end delivering a fourth phase of said third signal, said first and second phases, as well as said third and fourth phases, being opposite to each other; and
    a second capacitor connected between said other end of said third resistor and said other end of said fourth resistor; and
    wherein said AND gate circuit comprises a first AND gate circuit having first and second input terminals supplied with said first and third phases respectively, said first AND gate circuit delivering a first trigger pulse by detecting the logical sum of a first logic level of said first phase and a second logic level obtained by inverting the logic level of said third phase; and a second AND gate circuit having first and second input terminals supplied with said second and fourth phases respectively, said second AND gate circuit delivering a second trigger pulse by detecting the logical sum of a third logic level of said second phase and a fourth logic level obtained by inverting the logic level of said fourth phase, said first or second trigger pulse being provided as said trigger pulse.

4. A demodulator circuit according to claim 3 wherein said first and second AND gate circuits comprise a third transistor the base of which is supplied with the first phase of said first signal, and the collector of which is connected to a third voltage source;

a fourth transistor the base of which is supplied with the second phase of said first signal, the collector of which is connected to said third voltage source through a fifth resistor, and the emitter of which is connected to the emitter of said third transistor;

a fifth transistor the base of which is supplied with the third phase of said third signal, and the collector of which is connected to the collector of said fourth transistor;

a sixth transistor the base of which is supplied with the fourth phase of said third signal, the collector of which is connected to the emitter of said fourth transistor, and the emitter of which is connected to the emitter of said fifth transistor; and a third current source connected between the emitter of said sixth transistor and a fourth voltage source.

5. A demodulator circuit according to claim 4 wherein said third, fourth, fifth and sixth transistors are bipolar transistors, and level shift means are provided for supplying the collector-emitter passes of said fifth and sixth transistors with a potential difference higher than the collector-emitter saturation voltage of said transistors, said level shift means being disposed between the respective bases of said third and fifth transistors and between the respective bases of said fourth and sixth transistors.

6. A demodulator circuit according to claim 2 wherein said first current source is formed of a seventh transistor of a conductivity type opposite to that of said second transistor, the collector of which is connected to the collector of said second transistor, the emitter of which is connected to said first voltage source, and the base of which is supplied with a first bias potential to cause said first current to flow through the collector of said seventh transistor, a sixth resistor being connected between the collector and emitter of said seventh transistor; and said second current source is formed of an eighth transistor the collector of which is connected to the emitter of said second transistor, the emitter of which is connected to said second voltage source through a seventh resistor, and the base of which is supplied with a second bias potential to cause said second current to flow through the collector of said eighth transistor, and a ninth transistor the collector of which is connected to said first voltage source through an eighth resistor, the emitter of which is connected to said second voltage source through a ninth resistor, and the base of which is supplied with said second bias potential; and characterized in that a first ratio of said sixth resistor to said seventh resistor, a second ratio of said first resistor to said seventh resistor, a third ratio of said eighth resistor to said ninth resistor, and a first time constant given by the product of the values of said first capacitor and said second resistor are thermally compensated in order to achieve temperature-compensation of said second signal applied between the respective collectors of said second and ninth transistors.

7. A demodulator circuit according to claim 2, wherein said vibrator circuit includes means for negatively feeding back only a DC component of said second signal to said first current source in order to reduce thermal drifts of said output signal.

8. A demodulator circuit according to claim 2, wherein said vibrator circuit includes means for negatively feeding back only a DC component of said second signal to said second current source in order to reduce thermal drifts of said output signal.

9. A demodulator circuit according to claim 3 wherein said second capacitor includes an even number of stagger-connected PN junction capacitances.

10. A demodulator circuit according to claim 3 wherein said second capacitor includes an even number of stagger-connected MOS-transistor-type gate capacitances.

11. A demodulator circuit according to claim 4 wherein said second capacitor includes a capacitance formed between the respective bases of said fifth and sixth transistors.

12. A demodulator circuit according to claim 1 or 2, wherein said integration circuit is formed of a circuit having a linear delay transfer function provided by an integration resistor and an integration capacitance, wherein said integration capacitance includes a PN junction capacitance.

* * * * *